(12) United States Patent
Wu

(10) Patent No.: US 6,341,703 B1
(45) Date of Patent: Jan. 29, 2002

(54) WAFER CASSETTE HAVING DIVIDERS OF DIFFERENT LENGTH OR COLOR

(75) Inventor: Yi-Lang Wu, Ping Jenn (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/055,539

(22) Filed: Apr. 6, 1998

(51) Int. Cl.[7] .............................................. A47G 19/08
(52) U.S. Cl. ..................................... 211/41.18; 206/454
(58) Field of Search ........................... 211/41.11, 41.1, 211/40; 206/454, 306, 309; 312/9.48; D6/407

(56) References Cited

U.S. PATENT DOCUMENTS

| | | | | |
|---|---|---|---|---|
| 1,755,074 A | * | 4/1930 | Ray et al. ...................... | 211/40 |
| 4,231,473 A | * | 11/1980 | Aprahamian .............. | 211/40 X |
| 4,478,464 A | * | 10/1984 | Williams .................. | 312/9.48 |
| 4,707,247 A | * | 11/1987 | Savoy ...................... | 211/40 X |
| 4,724,963 A | * | 2/1988 | Mortensen ............. | 211/41.1 X |
| 4,757,623 A | * | 7/1988 | Seyler ....................... | 40/152.1 |
| 4,781,423 A | * | 11/1988 | Muenzer et al. ........ | 211/41.1 X |
| 4,796,756 A | * | 1/1989 | Ott .............................. | 206/454 |
| D307,680 S | * | 5/1990 | Ashkenazi ................... | D6/407 |
| 4,930,634 A | * | 6/1990 | Williams et al. ............ | 206/454 |
| 5,005,708 A | * | 4/1991 | Posso ........................ | 211/41.1 |
| 5,191,977 A | * | 3/1993 | Markovitz ................... | 206/309 |
| 5,297,675 A | * | 3/1994 | Martucci .................... | 206/309 |
| 5,393,135 A | * | 2/1995 | Tisbo et al. ................. | 312/9.48 |
| D361,687 S | * | 8/1995 | Dow et al. .................... | D6/407 |
| 5,505,299 A | * | 4/1996 | Ditzig et al. ............. | 206/308.1 |
| 5,558,235 A | * | 9/1996 | Hunt ........................... | 211/40 |
| 5,707,124 A | * | 1/1998 | Johnson et al. ............ | 312/9.48 |
| 5,749,477 A | * | 5/1998 | Chang ......................... | 211/40 |
| 5,853,214 A | * | 12/1998 | Babbs et al. .......... | 211/41.18 X |

* cited by examiner

Primary Examiner—Daniel P. Stodola
Assistant Examiner—Khoa Tran
(74) Attorney, Agent, or Firm—Tung & Associates

(57) ABSTRACT

A container for holding substrates such as a wafer cassette for holding semiconductor wafers is provided. The container is equipped with dividers on the interior sidewalls of the container which are of different lengths or different colors such that an operator when inserting a substrate into the container can easily identify the corresponding pairs of dividers to avoid the cross-slot misplacement of and the subsequent damage to the substrate.

6 Claims, 1 Drawing Sheet

WAFER CASSETTE HAVING DIVIDERS OF DIFFERENT LENGTH OR COLOR

FIELD OF THE INVENTION

The present invention generally relates to a container for holding substrates and more particularly, relates to a wafer cassette for holding wafers for transporting in a semiconductor fabrication facility wherein the cassette has dividers of different length or color such that cross-slot misplacement of wafers by an operator can be avoided.

BACKGROUND OF THE INVENTION

In the fabrication process for semiconductor devices, wafers of a semiconducting material are processed in various processes in which a plurality of wafers are frequently processed simultaneously. For instance, in a low pressure chemical vapor deposition (LPCVD) reactor, a large number of wafers can be processed in each run. The wafers are stacked side by side with only a few millimeters apart in a quartz reaction tube. The quartz reaction tube, sometimes called wafer boats, can hold up to 200 wafers. When the wafers are held vertically and separated from each other by a narrow space, a maximum wafer capacity can be achieved in a reaction chamber. For instance, wafers can be positioned in a diffusion or oxidation furnace wherein the wafers are placed perpendicular to a gas flow in a circular cross-sectioned quartz tube.

When a reactor is designed for a specific process, the geometry of the reactor is dictated by the pressure source and the energy source utilized in the reactor. The geometry of the reactor is also an important factor in the through-put rate of the reactor. In general, the reactor should be designed such that an equal flow of reactants can be delivered uniformly to each wafer. It is therefore more desirable to stack the wafers horizontally by laying them flat on a horizontal surface instead of stacking vertically at close spacing, even though the horizontal lay out is more susceptible to contamination by falling particles.

A vertical furnace operates essentially in the same manner as a horizontal furnace, except for the orientation of the wafers. In a vertical furnace, the wafers are loaded into a horizontal position by a wafer tweezer from a wafer cassette in which the wafers are stored or transported between processing stations. A wafer tweezer, or a wafer paddle that is utilized for transporting wafers into process machines from a wafer cassette is normally constructed of a quartz material that is capable of withstanding high temperature and corrosive environments. The wafer cassette, on the other hand, is normally constructed of a plastic material that is basically a container which has an open front and corrugated sidewalls formed by dividers for separating the wafers stored therein. The wafer cassette can be advantageously injection molded of a plastic material for accommodating a specifically sized substrate, i.e., a six inch or an eight inch wafer. A typical wafer cassette is shown in FIG. 1.

The wafer cassette 10, as shown in FIG. 1, is constructed by a top wall 12, a bottom wall 14, a back wall 16, and sidewalls 18 and 22. A cavity 24 is defined by the walls which also provides a front opening 26. On the interior surfaces 28 and 32 of the sidewalls 18 and 22, a corrugated configuration is formed by a plurality of dividers 34 and 36. The dividers 34, 36 are formed in ridge-shape that are oriented parallel with the bottom wall 14 and perpendicular to the rear wall 16. Slot-shaped openings, or receptacles 38, 42 are formed by the dividers 34 and 36. The dividers 34 and 36 are formed in a suitable length and thickness such that an electronic substrate, e.g., a wafer can be easily slid thereinto.

Since the wafer cassette 10 is used to store wafers between various fabrication processes and to transport wafers between various processing stations, the wafers contained therein are frequently inspected by an operator either for quality reasons or for identification of the wafer lots. When a wafer 20 is taken out of the cassette 10 and then manually put back in, human error frequently occurs which results in a wafer misplacement, i.e., a cross-slot placement of the wafer 20 as shown in FIG. 2. The cross-slot misplacement of a wafer into a wafer cassette occurs due to the large number of dividers on the sidewalls of the wafer cassette and the difficulty of identifying corresponding pairs of dividers on the opposite sidewalls of the cassette. The likelihood of making such mistakes is also contributed by the fact that the cassette is normally molded of a black plastic material.

When a cross-slot misplacement of wafer by an operator occurs, serious consequences can result when an automated wafer loader is used to unload the wafer from the cassette. For instance, when a wafer tweezer or paddle is used to unload wafers from a SMIF (standard mechanical interface machine) apparatus, the tweezer blade or paddle collides with the wafer that is misplaced resulting either in the breakage of wafer, a damage to the machine or both. In either event, the result can be catastrophic in lost wafer or machine down time. In using the presently available conventional wafer cassettes, the cross-slot misplacement of wafers by an operator cannot be avoided.

It is therefore an object of the present invention to provide a wafer cassette for holding wafers that does not have the drawbacks and shortcomings of the conventional wafer cassettes wherein wafers can be misplaced in the cassette.

It is another object of the present invention to provide a wafer cassette that is equipped with dividers on the sidewalls which are easily identifiable in matched pairs on the opposite sides of the wafer cassette cavity.

It is a further object of the present invention to provide a wafer cassette that is equipped with dividers which are fabricated of different colors such that corresponding pairs of the dividers on the opposite sidewalls of the cassette can be easily identified to avoid the cross-slot misplacement of the wafers by an operator.

It is another further object of the present invention to provide a wafer cassette that is equipped with dividers which are fabricated in different length in alternating orders such that corresponding pairs of the dividers on the opposite sidewalls of the cassette can be easily identified to facilitate the correct placement of wafers therein by an operator.

It is still another object of the present invention to provide a wafer cassette that is equipped with dividers on the opposite sidewalls of the cassette which are molded of at least two different colors in corresponding pairs such that a correct pair of dividers can be easily identified by an operator when manually inserting a wafer into the cassette.

It is yet another object of the present invention to provide a wafer cassette that is equipped with dividers which are ridge-shaped on the opposite sidewalls of the cassette that are of a thickness and a length sufficient for holding securely a wafer therein.

It is yet another further object of the present invention to provide a wafer cassette that is equipped with dividers located on the opposite interior sidewalls of the cassette that have at least two different lengths or colors in corresponding pairs for easy identification by an operator when inserting a wafer therein.

It is still another further object of the present invention to provide a wafer cassette that is equipped with dividers on the opposite interior sidewalls of the cassette which are made of different lengths between about 0.5 cm and about 2 cm with the oppositely positioned dividers on the two sidewalls being of the same length.

SUMMARY OF THE INVENTION

In accordance with the present invention, a container for holding electronic substrates that is equipped with dividers on the opposing interior sidewalls for holding the substrates which are of different lengths or colors in corresponding pairs is provided.

In a preferred embodiment, a container for holding substrates is provided which consists of a body that has a top wall, a bottom wall, a rear wall and two sidewalls forming an enclosure having a front opening and defining a cavity contained therein, a left sidewall and a right sidewall each having a corrugated interior surface, a first plurality of ridge-shaped dividers forming the corrugated interior surface on the left sidewall each having a base portion integral with the sidewall and a tip portion extending outwardly from the sidewall toward the cavity in the body, the ridge-shaped dividers are oriented parallel to the bottom wall and perpendicular to the rear wall defining slot-shaped receptacles therein between, a second plurality of ridge-shaped dividers forming the corrugated interior surface on the right sidewall each having a base portion integral with the sidewall and a tip portion extending outwardly from the sidewall toward the cavity in the body, the ridge-shaped dividers are oriented parallel to the bottom wall and perpendicular to the front opening defining slot-shaped receptacles therein between, each of the first and the second plurality of ridge-shaped dividers has a length and a thickness that are sufficient to support a substrate thereon without the occurrence of a substrate falling out of the receptacles or of contacting substrates immediately above or below the substrate, and each of even numbered dividers in the first and the second plurality of dividers appears different to an operator than each of odd numbered dividers wherein the even or odd numbered dividers are counted from the bottom-most divider.

The substrates held in the container are electronic substrates such as silicon wafers. The container can be advantageously used as a wafer cassette for transporting wafers in a semiconductor fabrication plant. The even numbered dividers in the first and the second plurality of dividers may have a different color than the odd numbered dividers. The even numbered dividers in the first and the second plurality of dividers may also have a different length than the odd numbered dividers. The first and the second plurality of ridge-shaped dividers are provided alternatingly in at least two different colors with the oppositely positioned dividers on the left and the right sidewalls being of the same color. The first and the second plurality of ridge-shaped dividers may also be provided alternatingly in at least two different lengths with the oppositely positioned dividers on the left and the right sidewalls being of the same length.

In another preferred embodiment of the present invention, a wafer cassette is provided which includes a cassette body which has a top wall, a bottom wall, a rear wall and two sidewalls forming an open-front enclosure and defining a cavity therein, a left sidewall and a right sidewall each having a corrugated interior surface, a first plurality of ridge-shaped dividers forming the corrugated interior surface in the left sidewall each having a base portion integral with the sidewall and a tip portion extending outwardly from the sidewall into the cavity in the body, the ridge-shaped dividers are oriented parallel to the bottom wall and perpendicular to the front opening defining slot-shaped receptacles therein between, a second plurality of ridge-shaped dividers forming the corrugated interior surface on the right sidewall each having a base portion integral with the sidewall and a tip portion extending outwardly from the sidewall into the cavity in the body, the ridge-shaped dividers are oriented parallel to the bottom wall and perpendicular to the front opening defining slot-shaped receptacles therein between, each of the first and the second plurality of ridge-shaped dividers has a length and a thickness that are sufficient to support a substrate thereon without the occurrence of a substrate falling out of the receptacles or of contacting substrates immediately adjacent to the substrate, and the first and the second plurality of ridge-shaped dividers are provided alternatingly in at least two different colors with the oppositely positioned dividers on the left sidewall and the right sidewall being of the same color. The at least two different colors are provided in sufficient distinction for detection by human eyes. The at least two different colors may be provided in two distinctly different colors. The at least two different colors may be three distinctly different colors. Suitable different colors may be blue and white, or black and white.

In yet another preferred embodiment of the present invention, a wafer cassette for loading of wafers without the cross-slot misplacement problem is provided which includes a cassette body that has a top wall, a bottom wall, a rear wall and two sidewalls forming an open-front enclosure and defining a cavity therein, a left sidewall and a right sidewall each has a corrugated interior surface, a first plurality of ridge-shaped dividers forming the corrugated interior surface in the left sidewall each has a base portion integral with the sidewall and a tip portion extending outwardly from the sidewall toward the cavity in the body, the ridge-shaped dividers are oriented parallel to the bottom wall and perpendicular to the rear wall defining slot-shaped receptacles therein between, a second plurality of ridge-shaped dividers forming the corrugated interior surface on the right sidewall each has a base portion integral with the sidewall and a tip portion extending outwardly from the sidewall toward the cavity in the body, the ridge-shaped dividers are oriented parallel to the bottom wall and perpendicular to the front opening defining slot-shaped receptacles therein between, each of the first and the second plurality of ridge-shaped dividers has a length and a thickness that are sufficient to support a substrate thereon, and the first and the second plurality of ridge-shaped dividers are provided alternatingly in at least two different lengths with the oppositely positioned dividers on the left and the right sidewalls of the same length. The at least two different lengths are determined as the distance between the base portion and the tip portion of the dividers. The at least two different lengths are selected between about 0.5 cm and about 2 cm. The at least two different lengths are also selected such that they are easily distinguishable by human eyes. The at least two different lengths are lengths preferably selected between about 1 cm and about 2 cm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a container for holding substrates, preferably electronic substrates such as wafers, that is fabricated with dividers on the interior sidewalls of the container that are of different length or color such that the corresponding pairs of dividers can be easily identified by an operator when inserting a substrate into a receptacle defined by the dividers such that a cross-slot misplacement does not occur. While the present invention container is especially suitable for holding electronic substrates, its application is in no way limited to such substrates. It can be broadly used in any type of container that has corrugated interior surfaces for holding flat objects therein such that objects can be placed in a correct manner for avoiding object breakage problem.

The present invention container, when utilized for holding electronic substrates such as wafers, can be configured in any dimensions for holding any size substrates such as a 150 mm substrate, a 200 mm substrate or any other diameter substrates. The dividers in the container are designed of a suitable thickness and length such that chances of substrates failing out of the receptacles formed by the dividers or substrates colliding with other substrates immediately adjacent can be eliminated. The purpose of the present invention is therefore to make dividers that are normally molded inside a container be easily recognizable in corresponding pairs on the opposite sides of the container such that a substrate may be correctly inserted into a receptacle defined by such dividers. The present invention novel container can be fabricated in various means, as exemplified below, in various preferred and alternate embodiments. For instance, by molding the dividers in different lengths or in different colors, or both.

Figure 1:
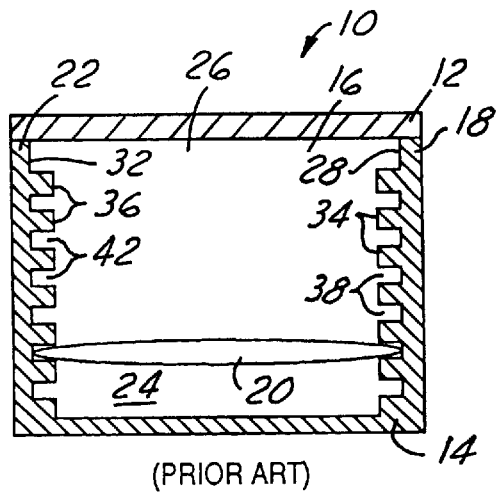
FIG. 1 is a cross-sectional view of a conventional wafer cassette equipped with identical dividers on the sidewalls.
Figure 2:
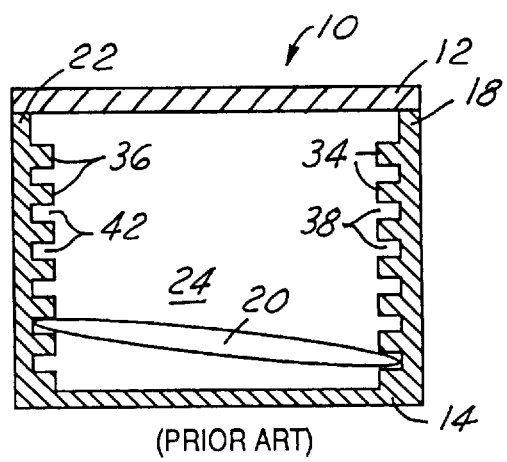
FIG. 2 is a cross-sectional view of the wafer cassette shown in FIG. 1 having a wafer misplaced in a cross-slot manner.
Figure 3:
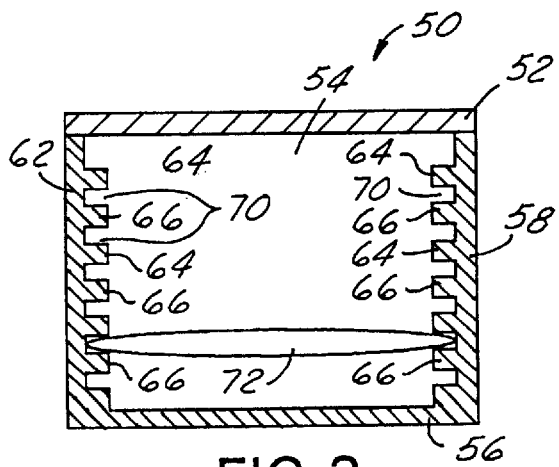
FIG. 3 is a cross-sectional view of the present invention wafer cassette wherein the dividers on the opposing sidewalls are provided in alternatingly different colors.

Referring initially to FIG. 3, wherein a container for holding substrates, or a wafer cassette 50 is shown. In wafer cassette 50, the exterior of the cassette is fabricated similarly to that of a conventional cassette by a top wall 52, a bottom wall 56, a rear wall 54 and sidewalls 58 and 62. On the sidewalls 58 and 62, dividers 64 and 66 are provided which are formed of different colored materials. For instance, when the wafer cassette 50 is fabricated by a plastic injection molding process, a dual-injection method (or a co-injection method) may be utilized wherein dividers 66 may be molded in a first shot with the cassette body in a first color while dividers 64 may be molded in a second shot of a differently colored plastic material. For instance, dividers 66 may be molded of a black plastic material as the body of the wafer cassette 50, while dividers 64 may be molded of a significantly lighter colored material such as white or grey. Slot-shaped openings, or receptacles 70 are formed between the dividers 64 and 66 for accommodating electronic substrates or wafers 72. The different colors utilized may be any two or more different colors that are easily distinguishable by human eyes. As a result, when an operator inserts wafer 72 into the receptacle 70 in the wafer cassette 50, the operator can easily identify the blue and the white dividers such that, as shown in FIG. 3, the wafer sits on top of blue dividers 66 and below the white dividers 64 when a blue material is utilized in molding dividers 66 and the cassette body. It should be recognized that, while only two colors are illustrated in FIG. 3, any suitable combination of colors may be utilized in identifying the various dividers. For instance, three different colors may be used to alternatingly identify the dividers in a sequence. The fabrication process for the wafer cassette may be more complicated and more costly when more than two colors are utilized. The dividers may also be colored by any other suitable means than the molded-in color method. The color should be permanently built into the dividers such that it does not become a which source of contamination for the wafers.

Figure 4:
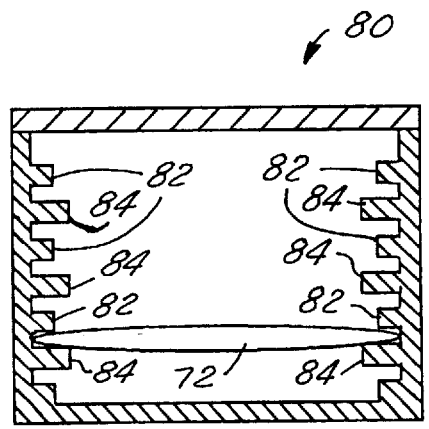
FIG. 4 is a cross-sectional view of the present invention wafer cassette wherein the dividers on the opposing sidewalls are provided in different lengths with the corresponding pairs of the same length.

In an alternate embodiment, as shown in FIG. 4, dividers of different lengths are fabricated in the wafer cassette 80. Dividers 82 are fabricated of a shorter length than dividers 84. In this embodiment, the fabrication process for the wafer cassette 80 may be simpler when a plastic injection molding process is utilized. A single injection molding process can be utilized by designing a mold cavity to provide longer and shorter dividers. The length difference between the dividers 82 and 84 should be sufficiently large such that it can be readily identified upon visual observation by an operator. For instance, the different lengths can be suitably chosen in the range of about 0.5 cm and about 2 cm and preferably between about 1 cm and about 2 cm. The length of the dividers depends on the size of the wafer. For instance, for larger wafers, i.e., wafers of 200 mm or 300 mm diameter, the length of the dividers could be made larger to accommodate the larger wafers. The range of dimensions for the dividers stated above is more suitable for wafers having a diameter of 200 mm or less. In utilizing a wafer cassette 80 shown in FIG. 4, an operator can easily identify the longer dividers 84 from the shorter dividers 82 and insert a wafer 72 therein onto the top of the longer dividers 84.

Figure 5:
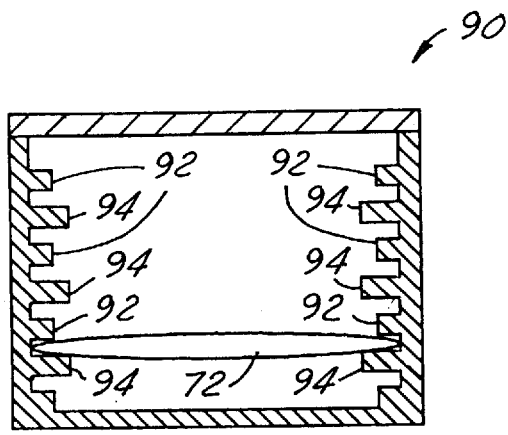
FIG. 5 is a cross-sectional view of the present invention wafer cassette wherein the dividers on the opposing sidewalls are fabricated of different lengths and of different colors with the corresponding pairs of dividers fabricated of the same length and of the same color.

In another alternate embodiment, a wafer divider 90 is provided in FIG. 5. To further improve the ease of identification of the dividers, wafer cassette 90 provides dividers 92 and 94 that are not only of different color but also of different length. The wafer cassette 90 can be fabricated by a similar process such as that used in fabricating the wafer cassette 50 of FIG. 3. The fabrication process may include the steps of both providing a mold cavity having different lengths dividers and a dual-injection molding process wherein two shots of differently colored plastic materials are used sequentially to mold differently colored dividers. More than two different colors and more than two different lengths of the dividers may be also be utilized to further facilitate the identification of corresponding pairs of dividers by an operator.

The present invention novel wafer cassette has therefore been amply described in the above descriptions and demonstrated in the appended drawings of FIGS. 3, 4 and 5. It should be recognized that while two different colors and two different lengths of dividers are shown for illustration purpose, any other combinations of colors and lengths of the dividers may be suitably utilized as a logical extension of the present invention.

While the present invention has been described in an illustrative manner, it should be understood that the terminology used is intended to be in a nature of words of description rather than of limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows:

1. A wafer cassette comprising:

a cassette body having a top wall, a bottom wall, a rear wall and two sidewalls forming an open-front enclosure and defining a cavity therein, a left sidewall and a right sidewall each having a corrugated interior surface, a first plurality of ridge-shaped dividers forming said corrugated interior surface in said left sidewall each having a base portion integral with the sidewall and a tip portion extending outwardly from said sidewall toward said cavity in said body, said ridge-shaped dividers being oriented parallel to said bottom wall and perpendicular to said front opening defining slot-shaped receptacles thereinbetween, a second plurality of ridge-shaped dividers forming said corrugated interior surface in said right sidewall each having a base portion integral with the sidewall and a tip portion extending outwardly from said sidewall toward said cavity in said body, said ridge-shaped dividers being oriented parallel to said bottom wall and perpendicular to said front opening defining slot-shaped receptacles thereinbetween, each of said first and second plurality of ridge-shaped dividers having a length and a thickness that is sufficient to support a substrate thereon without the occurrence of a substrate falling out of said receptacles or of contacting substrates immediately above or below said substrate, and said first and second plurality of ridge-shaped dividers are provided alternatingly in at least two different colors with the oppositely positioned dividers on the left sidewall and on the right sidewall being of the same color.

2. A wafer cassette according to claim 1, wherein said at least two different colors provided have sufficient distinction for detection by human eye.

3. A wafer cassette according to claim 1, wherein said at least two different colors are two distinctly different colors.

4. A wafer cassette according to claim 1, wherein said at least two different colors are three distinctly different colors.

5. A wafer cassette according to claim 1, wherein said at least two different colors are blue and white.

6. A wafer cassette according to claim 1, wherein said at least two different colors are black and white.

* * * * *